(12) United States Patent
Andoh et al.

(10) Patent No.: US 7,345,467 B2
(45) Date of Patent: Mar. 18, 2008

(54) VOLTAGE GENERATING APPARATUS, CURRENT GENERATING APPARATUS, AND TEST APPARATUS

(75) Inventors: Hiroki Andoh, Tokyo (JP); Hironori Tanaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/475,577

(22) Filed: Jun. 27, 2006

(65) Prior Publication Data

US 2007/0296400 A1    Dec. 27, 2007

(51) Int. Cl.
*G01R 31/28* (2006.01)
*G01R 31/02* (2006.01)

(52) U.S. Cl. .................... 324/158.1; 324/763
(58) Field of Classification Search ............ 324/158.1, 324/522–523, 713–714, 763
See application file for complete search history.

(56) References Cited

U.S. PATENT DOCUMENTS

| | | | | |
|---|---|---|---|---|
| 5,481,194 A | * | 1/1996 | Schantz et al. | 324/522 |
| 6,313,657 B1 | * | 11/2001 | Hashimoto | 324/763 |
| 6,864,693 B2 | * | 3/2005 | Kondo et al. | 324/713 |

* cited by examiner

*Primary Examiner*—Ha Tran Nguyen
*Assistant Examiner*—Joshua Benitez
(74) *Attorney, Agent, or Firm*—Osha Liang LLP

(57) ABSTRACT

There is provided a voltage generating apparatus that outputs a power source voltage from a voltage outputting terminal. The apparatus includes a voltage outputting section that outputs the power source voltage according to a current or voltage to be input, a first differential amplification section that compares the power source voltage and a preset first reference voltage to output a first control current or voltage reducing the power source voltage output from the voltage outputting section when the power source voltage is larger than the first reference voltage and output the first control current or voltage raising the power source voltage output from the voltage outputting section when the power source voltage is smaller than the first reference voltage, a current detector that detects a detecting voltage according to a power source current output from the voltage outputting terminal, a second differential amplification section that compares the detecting voltage detected from the current detector and a second reference voltage to output a second control current or voltage reducing the power source voltage when a value obtained by subtracting the second reference voltage from the detecting voltage is larger, an addition section that inputs a current or voltage obtained by adding the first control current or voltage and the second control current or voltage into the voltage outputting section, and a third differential amplification section that supplies a voltage obtained by amplifying a difference voltage obtained by subtracting the detecting voltage from a preset third reference voltage to the second differential amplification section as the second reference voltage.

4 Claims, 7 Drawing Sheets

VOLTAGE GENERATING APPARATUS, CURRENT GENERATING APPARATUS, AND TEST APPARATUS

BACKGROUND OF THE INVENTION

1. Field of the Invention

The present invention relates to a voltage generating apparatus, a current generating apparatus, and a test apparatus. More particularly, the present invention relates to a voltage generating apparatus for outputting a power source voltage, a current generating apparatus for outputting a power source current, and a test apparatus for testing a device under test.

2. Related Art

FIG. 7 is a view showing relation of a power source voltage $V_o$ to a power source current $I_o$ in a voltage generating apparatus including a conventional current limiting current. Conventionally, there has been known a voltage generating apparatus including a current limiting circuit that limits an electric current so that the electric current exceeding a predetermined value does not flow into a load. The limiting circuit detects a power source current $I_o$, and descends a power source voltage $V_o$ to constant gain when the detected power source current $I_o$ exceeds a limiting current $I_{CLP}$.

Meanwhile, in a conventional voltage generating apparatus, a different between a limiting current $I_{CLP}$ at the limit start and a power source current $I_{SHORT}$ at the load short (a power source voltage $V_o=0$) is large. When the power source current $I_{SHORT}$ at the load short is large, a conventional voltage generating apparatus may flow a large current into a load to destroy the load. Therefore, it is desirable that a difference between a limiting current $I_{CLP}$ at the limit start and a power source current $I_{SHORT}$ at the load short is small in a voltage generating apparatus.

SUMMARY OF THE INVENTION

Therefore, it is an object of the present invention to provide a voltage generating apparatus, a current generating apparatus, and a test apparatus that can solve the foregoing problems. The above and other objects can be achieved by combinations described in the independent claims. The dependent claims define further advantageous and exemplary combinations of the present invention.

That is, according to the first aspect of the present invention, there is provided a voltage generating apparatus that outputs a power source voltage from a voltage outputting terminal. The voltage generating apparatus includes: a voltage outputting section that outputs the power source voltage according to a current or voltage to be input; a first differential amplification section that compares the power source voltage and a preset first reference voltage to output a first control current or voltage reducing the power source voltage output from the voltage outputting section when the power source voltage is larger than the first reference voltage and output the first control current or voltage raising the power source voltage output from the voltage outputting section when the power source voltage is smaller than the first reference voltage; a current detector that detects a detecting voltage according to a power source current output from the voltage outputting terminal; a second differential amplification section that compares the detecting voltage detected from the current detector and a second reference voltage to output a second control current or voltage reducing the power source voltage when a value obtained by subtracting the second reference voltage from the detecting voltage is larger; an addition section that inputs a current or voltage obtained by adding the first control current or voltage and the second control current or voltage into the voltage outputting section; and a third differential amplification section that supplies a voltage obtained by amplifying a difference voltage obtained by subtracting the detecting voltage from a preset third reference voltage to the second differential amplification section as the second reference voltage.

The current detector may include: a series resistor that is provided on electric wiring between an output of the voltage outputting section and the voltage outputting terminal; and a differential amplifier that detects the power source current by outputting a detecting voltage according to a potential difference between both ends of the series resistor.

According to the second aspect of the present invention, there is provided a current generating apparatus that outputs a power source current from a current outputting terminal. The current generating apparatus includes: a current outputting section that outputs the power source current according to a current or voltage to be input; a current detector that detects a detecting voltage according to the power source current output from the current outputting terminal; a fourth differential amplification section that compares the detecting voltage and a fourth reference voltage according to a preset first reference current to output a first control current or voltage reducing the power source current output from the current outputting section when the power source current is larger than the first reference current and output the first control current or voltage raising the power source current output from the current outputting section when the power source current is smaller than the first reference current; a fifth differential amplification section that compares a power source voltage at the current outputting terminal and a fifth reference voltage to output a second control current or voltage reducing the power source current when a value obtained by subtracting the fifth reference voltage from the power source voltage is larger, an addition section that inputs a current or voltage obtained by adding the first control current or voltage and the second control current or voltage into the current outputting section; and a sixth differential amplification section that supplies a voltage obtained by amplifying a difference voltage obtained by subtracting the power source voltage from a preset sixth reference voltage to the fifth differential amplification section as the fifth reference voltage.

The current detector may include: a series resistor that is provided on electric wiring between an output of the current outputting section and the current outputting terminal; and a differential amplifier that detects the power source current by outputting a detecting voltage according to a potential difference between both ends of the series resistor.

According to the third aspect of the present invention, there is provided a test apparatus that tests a device under test. The test apparatus includes: a voltage generating apparatus that outputs a power source voltage to be supplied to the device under test from a voltage outputting terminal; and a test processing section that tests the device under test in a state that the voltage generating apparatus has supplied the power source voltage to the device under test, in which the voltage generating apparatus includes: a voltage outputting section that outputs the power source voltage according to a current or voltage to be input; a first differential amplification section that compares the power source voltage and a preset first reference voltage to output a first control current or voltage reducing the power source voltage output from the voltage outputting section when the power source voltage is larger than the first reference voltage and output the first control current or voltage raising the power source voltage output from the voltage outputting section when the power source voltage is smaller than the first reference voltage; a current detector that detects a detecting voltage according to a power source current output from the voltage outputting terminal; a second differential amplification section that compares the detecting voltage detected from the current detector and a second reference voltage to output a second control current or voltage reducing the power source voltage when a value obtained by subtracting the second reference voltage from the detecting voltage is larger; an addition section that inputs a current or voltage obtained by adding the first control current or voltage and the second control current or voltage into the voltage outputting section; and a third differential amplification section that supplies a voltage obtained by amplifying a difference voltage obtained by subtracting the detecting voltage from a preset third reference voltage to the second differential amplification section as the second reference voltage.

According to the fourth aspect of the present invention, there is provided a test apparatus that tests a device under test. The test apparatus includes: a current generating apparatus that outputs a power source current to be supplied to the device under test from a current outputting terminal; and a test processing section that tests the device under test in a state that the current generating apparatus has supplied the power source current to the device under test, in which the current generating apparatus includes: a current outputting section that outputs the power source current according to a current or voltage to be input; a current detector that detects the power source current output from the current outputting terminal; a fourth differential amplification section that compares the power source current and a preset first reference current to output a first control current or voltage reducing the power source current output from the current outputting section when the power source current is larger than the first reference current and output the first control current or voltage raising the power source current output from the current outputting section when the power source current is smaller than the first reference current; a fifth differential amplification section that compares a power source voltage at the current outputting terminal and a second reference voltage to output a second control current or voltage reducing the power source current when a value obtained by subtracting the second reference voltage from the power source voltage is larger; an addition section that inputs a current or voltage obtained by adding the first control current or voltage and the second control current or voltage into the current outputting section; and a sixth differential amplification section that supplies a voltage obtained by amplifying a difference voltage obtained by subtracting the power source voltage from a preset third reference voltage to the fifth differential amplification section as the second reference voltage.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
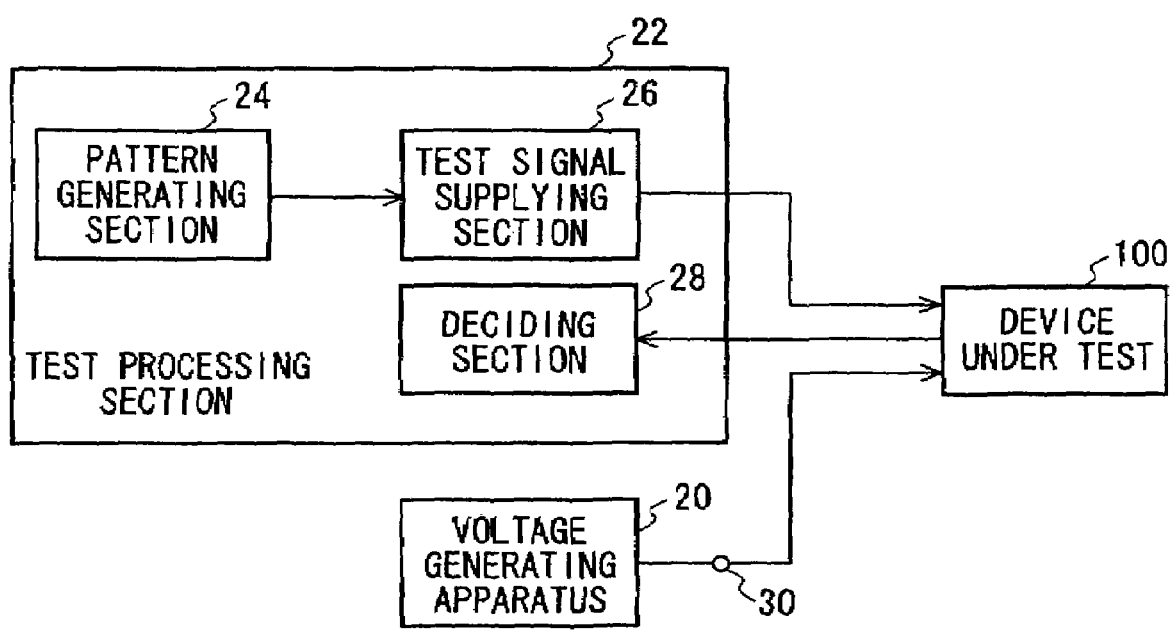
FIG. 1 is a view showing a configuration of a test apparatus according to an embodiment of the present invention along with a device under test.

FIG. 1 is a view showing a configuration of a test apparatus 10 according to an embodiment along with a device under test 100. The test apparatus 10 includes a voltage generating apparatus 20 and a test processing section 22, and tests the device under test 100. The voltage generating apparatus 20 outputs a power source voltage $V_o$ to be supplied to the device under test 100 from a voltage outputting terminal 30 thereof. The test processing section 22 tests the device under test 100 in a state that the voltage generating apparatus 20 has supplied a power source voltage to the device under test 100. As an example, the test processing section 22 may have a pattern generating section 24, a test signal supplying section 26, and a deciding section 28. The pattern generating section 24 generates a test pattern from designating a pattern of a test signal. The test signal supplying section 26 supplies a test signal according to a test pattern to the device under test 100. The deciding section 28 decides the good or bad of the device under test using an output signal output from the device under test 100 according to the supplied test signal.

Figure 2:
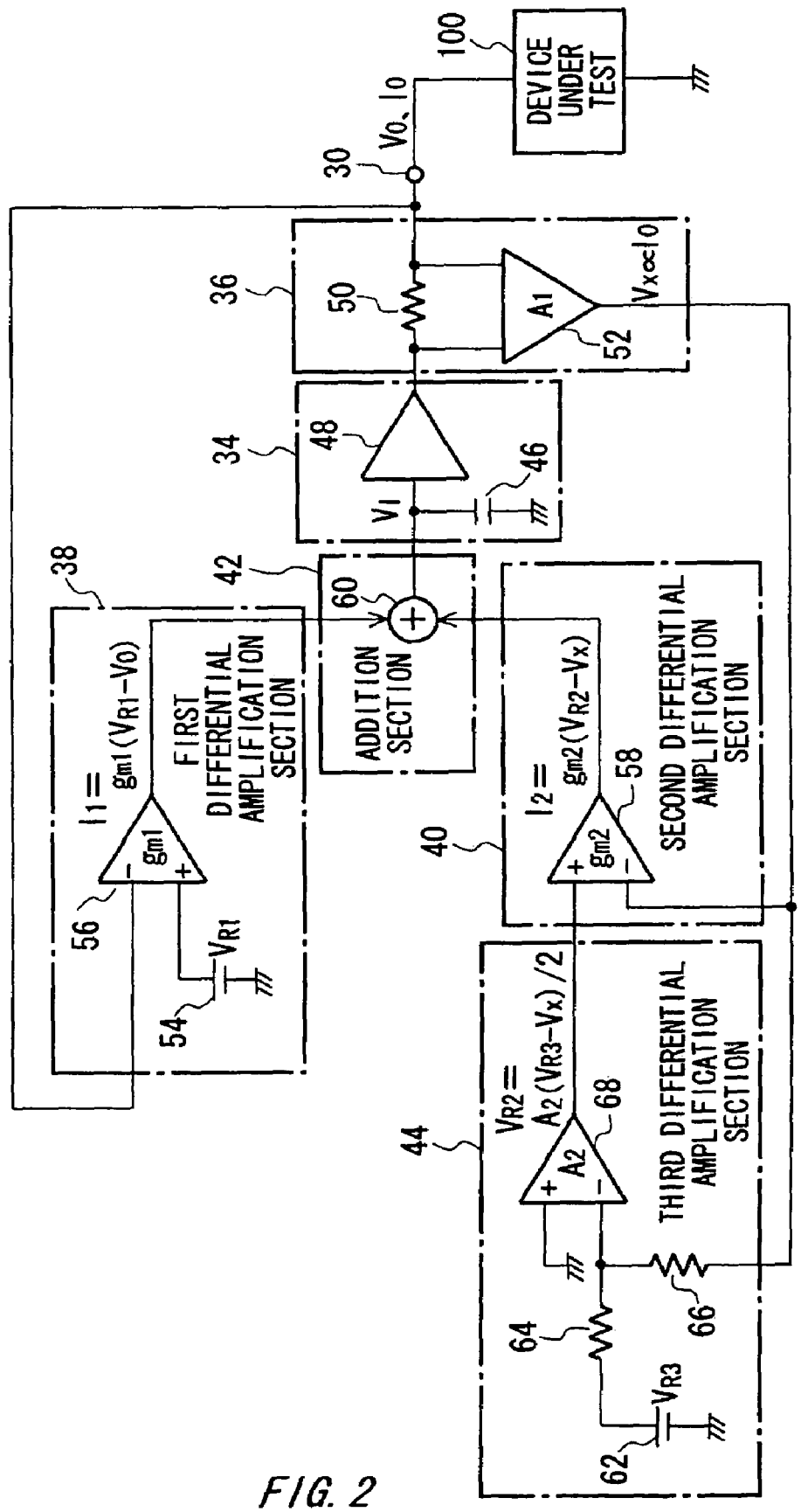
FIG. 2 is a view showing a configuration of a voltage generating apparatus according to an embodiment of the present invention along with a device under test.

FIG. 2 is a view showing a configuration of the voltage generating apparatus 20 according to the present embodiment along with the device under test 100. The voltage generating apparatus 20 has a voltage outputting section 34, a current detector 36, a first differential amplification section 38, a second differential amplification section 40, an addition section 42, and a third differential amplification section 44. The voltage generating apparatus 20 outputs the power source voltage $V_o$ to be supplied to the device under test 100 that is a load from the voltage outputting terminal 30.

The voltage outputting section 34 outputs the power source voltage $V_o$ according to an input current or an input voltage to be input. The voltage outputting section 34 supplies the power source voltage $V_o$ to the device under test 100 via the voltage outputting terminal 30. In the present embodiment, the voltage outputting section 34 includes a smoothing capacitor 46 and a voltage outputting circuit 48, and outputs a power source voltage $V_o$ according to an input current. The smoothing capacitor 46 is charged with electric currents output from the addition section 42 to generate an input voltage $V_I$ according to an integral value of electric currents output from the addition section 42 between terminals thereof. The voltage outputting circuit 48 outputs a power source voltage $V_o$ according to the input voltage $V_I$ generated between the terminals of the smoothing capacitor 46.

The current detector 36 detects a detecting voltage $V_X$ according to a power source current $I_O$ output from the voltage outputting terminal 30. In the present embodiment, the current detector 36 includes a series resistor 50 and a first voltage output differential amplifier 52. The series resistor 50 is provided on electric wiring between an output of the voltage outputting section 34 and the voltage outputting terminal 30, and generates a voltage difference in proportion to the power source current $I_O$ on both ends thereof. The first voltage output differential amplifier 52 outputs a detecting voltage $V_X$ obtained by amplifying a potential difference between the both ends of the series resistor 50. The first voltage output differential amplifier 52 detects the power source current $I_O$ by outputting the detecting voltage $V_X$ according to the potential difference between the both ends of the series resistor 50.

The first differential amplification section 38 compares the power source voltage $V_O$ and a preset first reference voltage $V_{RI}$. Then, the first differential amplification section 38 outputs a first control current or voltage lowering the power source voltage $V_O$ output from the voltage outputting section 34 when the power source voltage $V_O$ is larger than the first reference voltage $V_{RI}$, and outputs the first control current or voltage raising the power source voltage $V_O$ output from the voltage outputting section 34 when the power source voltage $V_O$ is smaller than the first reference voltage $V_{RI}$. In the present embodiment, the first differential amplification section 38 includes a first voltage generating section 54 and a first current output differential amplifier 56. The first voltage generating section 54 generates the first reference voltage $V_{RI}$. The first current output differential amplifier 56 outputs a first control current $I_1$ in proportion to a voltage obtained by subtracting the power source voltage $V_O$ from the first reference voltage $V_{R1}$ generated from the first voltage generating section 54.

The second differential amplification section 40 compares the detecting voltage $V_X$ according to the power source current $I_O$ detected from the current detector 36 and a second reference voltage $V_{R2}$ that becomes small as the power source current $I_O$ becomes larger. Then, the second differential amplification section 40 outputs a second control current or voltage lowering the power source voltage $V_O$ when a value obtained by subtracting the second reference voltage $V_{R2}$ from the detecting voltage $V_X$ according to the power source current $I_O$ is larger. In the present embodiment, the second differential amplification section 40 includes a second current output differential amplifier 58. The second current output differential amplifier 58 inputs the second reference voltage $V_{R2}$ that becomes small as the power source current $I_O$ becomes larger and the detecting voltage $V_X$ that becomes large as the power source current $I_O$ becomes larger. Then, the second current output differential amplifier 58 outputs a second control current $I_2$ in proportion to a voltage obtained by subtracting the detecting voltage $V_X$ from the second reference voltage $V_{R2}$. Furthermore, the second current output differential amplifier 58 sets the second control current $I_2$ to zero when the detecting voltage $V_X$ shows that the power source current $I_O$ is less than a limiting current $I_{CLP}$.

The addition section 42 supplies a current or voltage obtained by adding the first control current or voltage output from the first differential amplification section 38 and the second control current or voltage output from the second differential amplification section 40 to the voltage outputting section 34 as an input current or an input voltage $V_I$. In the present embodiment, the addition section 42 includes a current adder 60. The current adder 60 outputs an electric current obtained by adding the first control current $I_1$ output from the first current output differential amplifier 56 and the second control current $I_2$ output from the second current output differential amplifier 58. As an example, the current adder 60 may be a connecting point for connecting an output port of the first current output differential amplifier 56, an output port of the second current output differential amplifier 58, and an input port of the voltage outputting section 34. In this way, the current adder 60 can charge the smoothing capacitor 46 with electric currents obtained by adding the first control current $I_1$ and the second control current $I_2$. Therefore, the current adder 60 can input the input voltage $V_I$ according to an integral value of the electric currents into the voltage outputting circuit 48.

The third differential amplification section 44 supplies a voltage obtained by amplifying a difference voltage obtained by subtracting the detecting voltage $V_X$ according to the power source current $I_O$ from a preset third reference voltage $V_{R3}$ to the second differential amplification section 40 as the second reference voltage $V_{R2}$. In this way, the third differential amplification section 44 can output the second reference voltage $V_{R2}$ that becomes small as the power source current $I_O$ becomes larger.

In the present embodiment, the third differential amplification section 44 includes a second voltage generating section 62, a first resistor 64, a second resistor 66, and a second voltage output differential amplifier 68. The second voltage generating section 62 generates the third reference voltage $V_{R3}$. The first resistor 64 and the second resistor 66 subtract the third reference voltage $V_{R3}$ generated from the second voltage generating section 62 from the detecting voltage $V_X$ output from the first voltage output differential amplifier 52, in order to generate a partial-pressure voltage $((V_X - V_{R3})/2)$ obtained by dividing the subtracted result by a predetermined resistance ratio (for example, ½). The second voltage output differential amplifier 68 supplies the second reference voltage $V_{R2}$ in proportion to a voltage obtained by subtracting the partial-pressure voltage $((V_X - V_{R3})/2)$ generated by the first resistor 64 and the second resistor 66 from a ground voltage (0V) to the second current output differential amplifier 58. In this way, the second voltage output differential amplifier 68 can output the second reference voltage $V_{R2}$ that becomes small as the power source current $I_O$ becomes larger.

Figure 3:
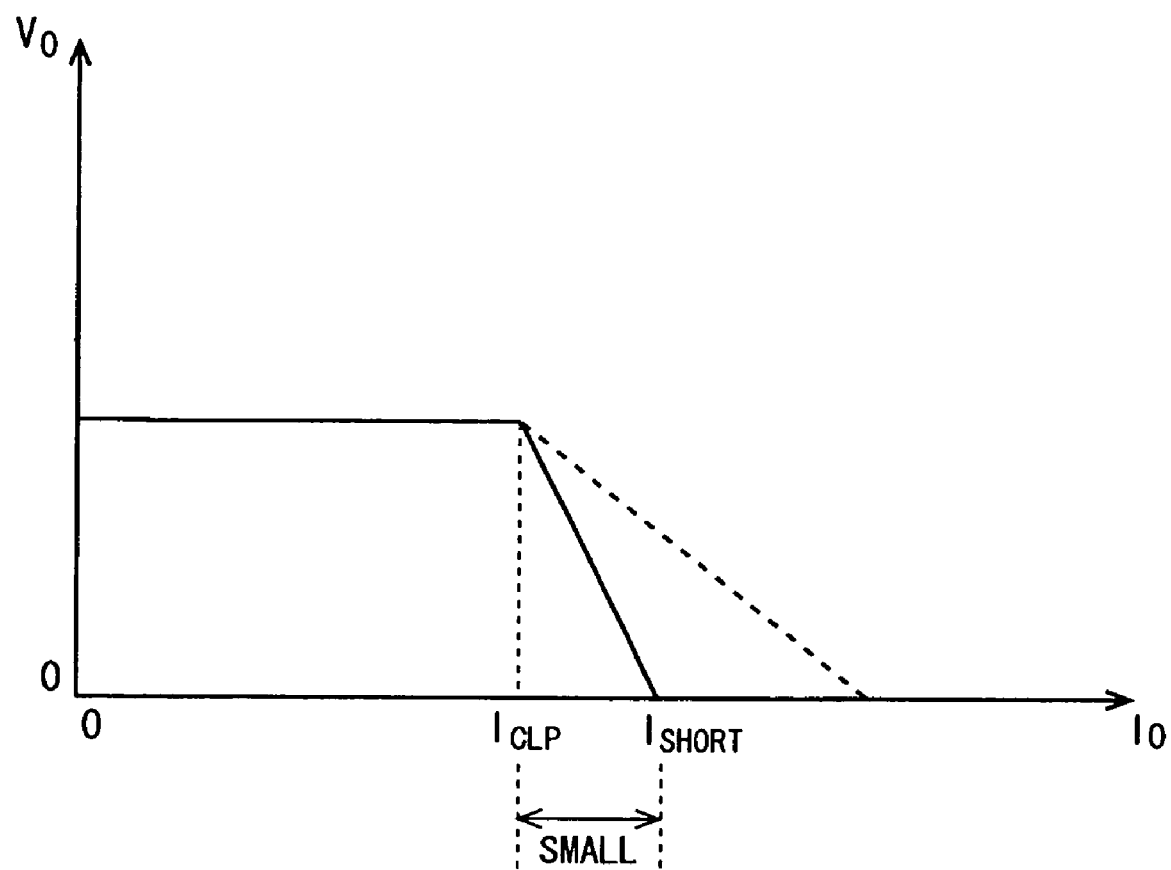
FIG. 3 is a view showing relation of a power source voltage $V_o$ to a power source current $I_o$ in a voltage generating apparatus according to an embodiment of the present invention.

FIG. 3 is a view showing relation of the power source voltage $V_O$ to the power source current $I_O$ in the voltage generating apparatus 20 according to the present embodiment. In addition, a thick dotted line in FIG. 3 shows the power source voltage $V_O$ to the power source current $I_O$ when it is assumed that there is not the third differential amplification section 44.

The first current output differential amplifier 56 increases or decreases the first control current $I_1$ to be output so as to control the power source voltage $V_O$ to a predetermined value. When the power source current $I_O$ is less than or equal to the limiting current $I_{CLP}$, the second current output differential amplifier 58 sets the second control current I₂ to zero. In this way, according to the voltage generating apparatus 20, when the power source current $I_O$ is less than or equal to the limiting current $I_{CLP}$, it is possible to stably output a predetermined power source voltage $V_O$ by the control by the first current output differential amplifier 56.

Then, when the power source current $I_O$ exceeds the limiting current $I_{CLP}$, the second current output differential amplifier 58 supplies the minus second control current I₂, an absolute value of which becomes large as the power source current $I_O$ becomes large, to the current adder 60. In other words, the second current output differential amplifier 58 absorbs an amount of the current that becomes large as the power source current $I_O$ becomes large from the current adder 60. As a result, the second current output differential amplifier 58 absorbs, from the current adder 60, an electric current for an amount of the first control current I₁ output from the first current output differential amplifier 56, and additionally absorbs electric charges charged in the smoothing capacity 46. Therefore, the second current output differential amplifier 58 reduces the input voltage V₁ for the voltage outputting circuit 48.

In this way, the voltage generating apparatus 20 can reduce the power source voltage $V_O$ when the power source current $I_O$ exceeds the limiting current $I_{CLP}$, in order to control an excess current not to flow into the device under test 100.

Furthermore, the second current output differential amplifier 58 outputs the second control current I₂ with an amount of the current according to the difference between the second reference voltage $V_{R2}$ that becomes small as the power source current $I_O$ becomes larger by the control of the third differential amplification section 44 and the detecting voltage $V_X$ according to the power source current $I_O$. In this way, as shown with a solid line in FIG. 3, the voltage generating apparatus 20 can reduce the power source voltage $V_O$ as the power source current $I_O$ becomes larger with higher DC precision in a range in which the power source current $I_O$ exceeds the limiting current $I_{CLP}$. Therefore, the voltage generating apparatus 20 can reduce the difference between the limiting current $I_{CLP}$ at the limit start and a power source current $I_{SHORT}$ at short of the voltage outputting terminal 30, in order to limit the power source current $I_O$ with a good characteristic.

In addition, as an example, the third differential amplification section 44 for outputting the second reference voltage $V_{R2}$ reduces an amplification degree in a high-frequency area (for example, an amplification degree is one), and increases an amplification degree in a low-frequency area (for example, A₂ (A₂ is a value higher than one)). In other words, the third differential amplification section 44 may reduce an amplification degree in frequency higher than fluctuation frequency of the power source current $I_O$ according to the fluctuation of a load (for example, one), and increases an amplification degree in frequency less than or equal to fluctuation frequency of the power source current $I_O$ according to the fluctuation of a load (for example, A₂). In this way, since the voltage generating apparatus 20 can reduce loop gain to limit the power source current $I_O$ in a high-frequency area, it is possible to stably reduce the power source current $I_O$.

Figure 4:
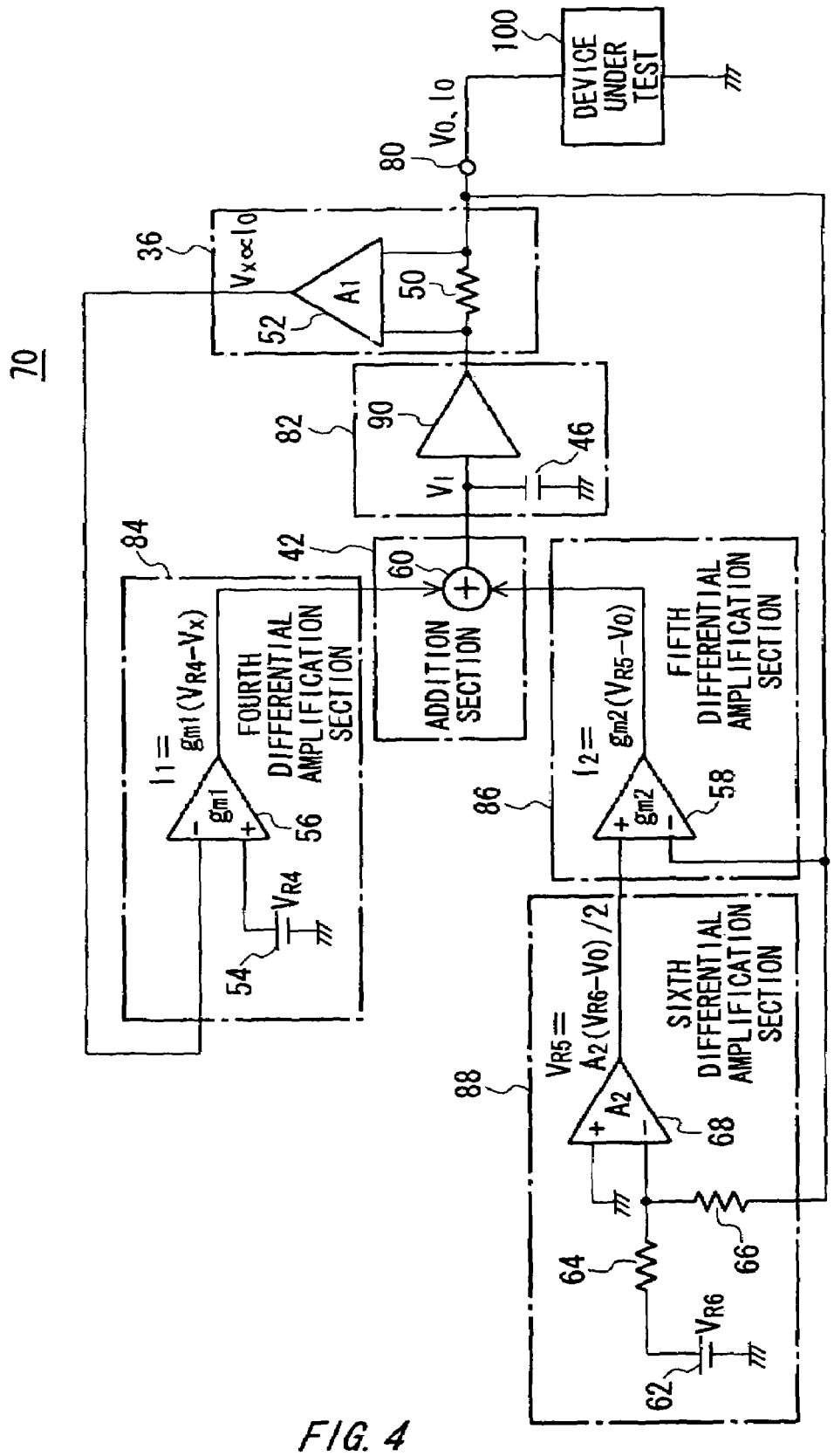
FIG. 4 is a view showing a configuration of a current generating apparatus according to the first alternative example of the present embodiment along with a device under test.

FIG. 4 is a view showing a configuration of a current generating apparatus 70 according to the first alternative example of the present embodiment along with the device under test 100. In addition, since the current generating apparatus 70 shown in FIG. 4 has the generally same configuration and function as those of the voltage generating apparatus 20 shown in FIG. 2, their descriptions will be omitted except points of difference about the generally same components as those included in the voltage generating apparatus 20.

The test apparatus 10 may include the current generating apparatus 70 hat outputs a power source current $I_O$ to be supplied to the device under test 100 from a current outputting terminal 80, in place of the voltage generating apparatus 20. The current generating apparatus 70 has a current detector 36, an addition section 42, a current outputting section 82, a fourth differential amplification section 84, a fifth differential amplification section 86, and a sixth differential amplification section 88. The current detector 36 detects the power source current $I_O$ output from the current outputting terminal 80. In the present alternative example, the current detector 36 includes a series resistor 50 and a first voltage output differential amplifier 52. The series resistor 50 is provided on electric wiring between the current outputting section 82 and the current outputting terminal 80.

The current outputting section 82 outputs the power source current $I_O$ according to an input current or input voltage to be input. The current outputting section 82 supplies the power source current $I_O$ to the device under test 100 via the current outputting terminal 80. In the present alternative example, the current outputting section 82 includes a smoothing capacitor 46 and a current outputting circuit 90. The current outputting circuit 90 outputs the power source current $I_O$ according to an input voltage V₁ generated on the smoothing capacitor 46.

The fourth differential amplification section 84 compares a detecting voltage $V_X$ according to the power source current $I_O$ and a preset fourth reference voltage $V_{R4}$. Then, the fourth differential amplification section 84 outputs a first control current or voltage reducing the power source current $I_O$ output from the current outputting section 82 when the power source current $I_O$ is larger than the fourth reference voltage $V_{R4}$, and outputs the first control current or voltage raising the power source current $I_O$ output from the current outputting section 82 when the power source current I₀ is smaller than the fourth reference voltage $V_{R4}$. In the present alternative example, the fourth differential amplification section 84 includes a first voltage generating section 54 and a first current output differential amplifier 56. The first current output differential amplifier 56 outputs a first control current I₁ in proportion to a voltage obtained by subtracting a detecting voltage $V_X$ detected from the current detector 36 from the fourth reference voltage $V_{R4}$ generated from the first voltage generating section 54.

The fifth differential amplification section 86 compares the power source voltage $V_O$ of the current outputting terminal 80 and a fifth reference voltage $V_{R5}$ that becomes small as the power source voltage $V_O$ becomes larger. Then, the fifth differential amplification section 86 outputs a second control current or voltage preferably reducing the power source current $I_O$ when a value obtained by subtracting the fifth reference voltage $V_{R5}$ from the power source voltage $V_O$ is larger. In the present alternative example, the fifth differential amplification section 86 includes a second current output differential amplifier 58. The second current output differential amplifier 58 inputs the fifth reference voltage $V_{R5}$ and the power source voltage $V_O$. Then, the second current output differential amplifier 58 outputs a second control current I₂ in proportion to a voltage obtained by subtracting the power source voltage $V_O$ from the fifth reference voltage $V_{R5}$. Furthermore, the second current output differential amplifier 58 sets the second control current $I_2$ to zero when the power source voltage $V_O$ is less than or equal to a limiting voltage $V_{CLP}$.

The sixth differential section 88 supplies a voltage obtained by amplifying a difference voltage obtained by subtracting the power source voltage $V_O$ from a preset sixth reference voltage $V_{R6}$ to the fifth differential amplification section 86 as the fifth reference voltage $V_{R5}$. In this way, the sixth differential amplification section 88 can supply the fifth reference voltage $V_{R5}$ that becomes small as the power source voltage $V_O$ becomes larger.

In the present alternative example, the sixth differential amplification section 88 includes a second voltage generating section 62, a first resistor 64, a second resistor 66, and a second voltage output differential amplifier 68. The first resistor 64 and the second resistor 66 subtract the sixth reference voltage $V_{R6}$ generated from the second voltage generating section 62 from the output voltage $V_O$, in order to generate a partial-pressure voltage (($V_O$-$V_{R3}$)/2) obtained by dividing the subtracted result by a predetermined resistance ratio (for example, ½). The second voltage output differential amplifier 68 supplies the fifth reference voltage $V_{R5}$ in proportion to a voltage obtained by subtracting the partial-pressure voltage (($V_O$-$V_{R3}$)/2) generated by the first resistor 64 and the second resistor 66 from a ground voltage (0V) to the second current output differential amplifier 58. In this way, the second voltage output differential amplifier 68 can supply the fifth reference voltage $V_{R5}$ that becomes small as the power source voltage $V_O$ becomes larger, to the second current output differential amplifier 58.

Figure 5:
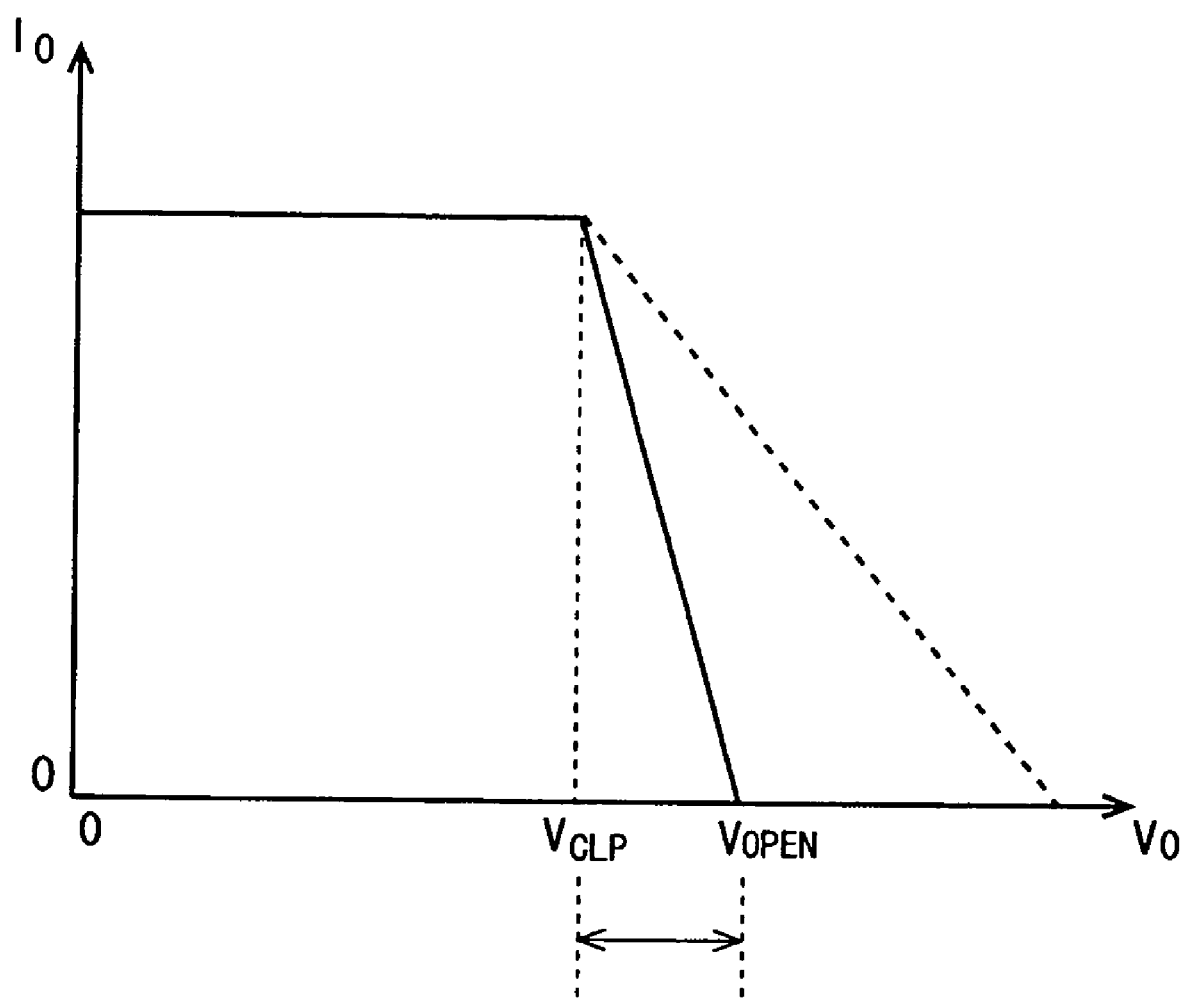
FIG. 5 is a view showing relation of a power source current $I_o$ to a power source voltage $V_o$ in a current generating apparatus according to the first alternative example.

FIG. 5 is a view showing relation to a power source current $I_O$ to a power source voltage $V_O$ in the current generating apparatus 70 according to the present embodiment. In addition, a thick dotted line in FIG. 5 shows the power source current $I_O$ to the power source voltage $V_O$ when it is assumed that there is not the sixth differential amplification section 88.

The first current output differential amplifier 56 increases or decreases the first control current $I_1$ to be output so as to control the power source current $I_O$ to a predetermined value. When the power source voltage $V_O$ is less than or equal to the limiting voltage $V_{CLP}$, the second current output differential amplifier 58 sets the second control current $I_2$ to zero. In this way, according to the current generating apparatus 70, when the power source voltage $V_O$ is less than or equal to the limiting voltage $V_{CLP}$, it is possible to stably output a predetermined power source current $I_O$ by the control by the first current output differential amplifier 56.

Then when the power source voltage $V_O$ exceeds the limiting voltage $V_{CLP}$, the second current output differential amplifier 58 supplies the minus second control current $I_2$, an absolute value of which becomes large as the power source voltage $V_O$ becomes large, to the current adder 60. In other words, the second current output differential amplifier 58 absorbs an amount of the current that becomes large as the power source voltage $V_O$ becomes large from the current adder 60. As a result, the second current output differential amplifier 58 absorbs, from the current adder 60, an electric current for an amount of the first control current $I_1$ output from the first current output differential amplifier 56, and additionally absorbs electric charges charged in the smoothing capacitor 46. Therefore, the second current output differential amplifier 58 reduces the input voltage $V_1$ for the current outputting circuit 82.

In this way, the current generating apparatus 70 can reduce the power source current $I_O$ when the power source voltage $V_O$ exceeds the limiting voltage $V_{CLP}$, in order to control an excess voltage not to flow into the device under test 100.

Furthermore, the second current output differential amplifier 58 outputs the second control current $I_2$ with an amount of the current according to the difference between the fifth reference voltage $V_{R5}$ that becomes small as the power source voltage $V_O$ becomes larger by the control of the sixth differential amplification section 88 and the detecting voltage $V_X$ according to the power source voltage $V_O$. In this way, as shown with a solid line in FIG. 5, the current generating apparatus 70 can reduce the power source current $I_O$ as the power source voltage $V_O$ becomes large with higher DC precision in a range in which the power source voltage $V_O$ exceeds the limiting voltage $V_{CLP}$. Therefore, the current generating apparatus 70 can reduce the difference between the limiting voltage $V_{CLP}$ at the limit start and a power source voltage $V_{OPEN}$ at open of the voltage outputting terminal 30, in order to limit the power source voltage $V_O$ with a good characteristic.

In addition, as an example, the sixth differential amplification section 88 for outputting the fifth reference voltage $V_{R5}$ reduces an amplification degree in a high-frequency area (for example, an amplification degree is one), and increases an amplification degree in a low-frequency area (for example, $A_2$ ($A_2$ is a value higher than one)). In other words, the sixth differential amplification section 88 may reduce an amplification degree in frequency higher than fluctuation frequency of the power source voltage $V_O$ according to the fluctuation of a load (for example, one), and increases an amplification degree in frequency less than or equal to fluctuation frequency of the power source voltage $V_o$ according to the fluctuation of a load (for example, $A_2$). In this way, since the current generating apparatus 70 can reduce loop gain to limit the power source voltage $V_O$ in a high-frequency area, it is possible to stably reduce the power source voltage $V_O$.

Figure 6:
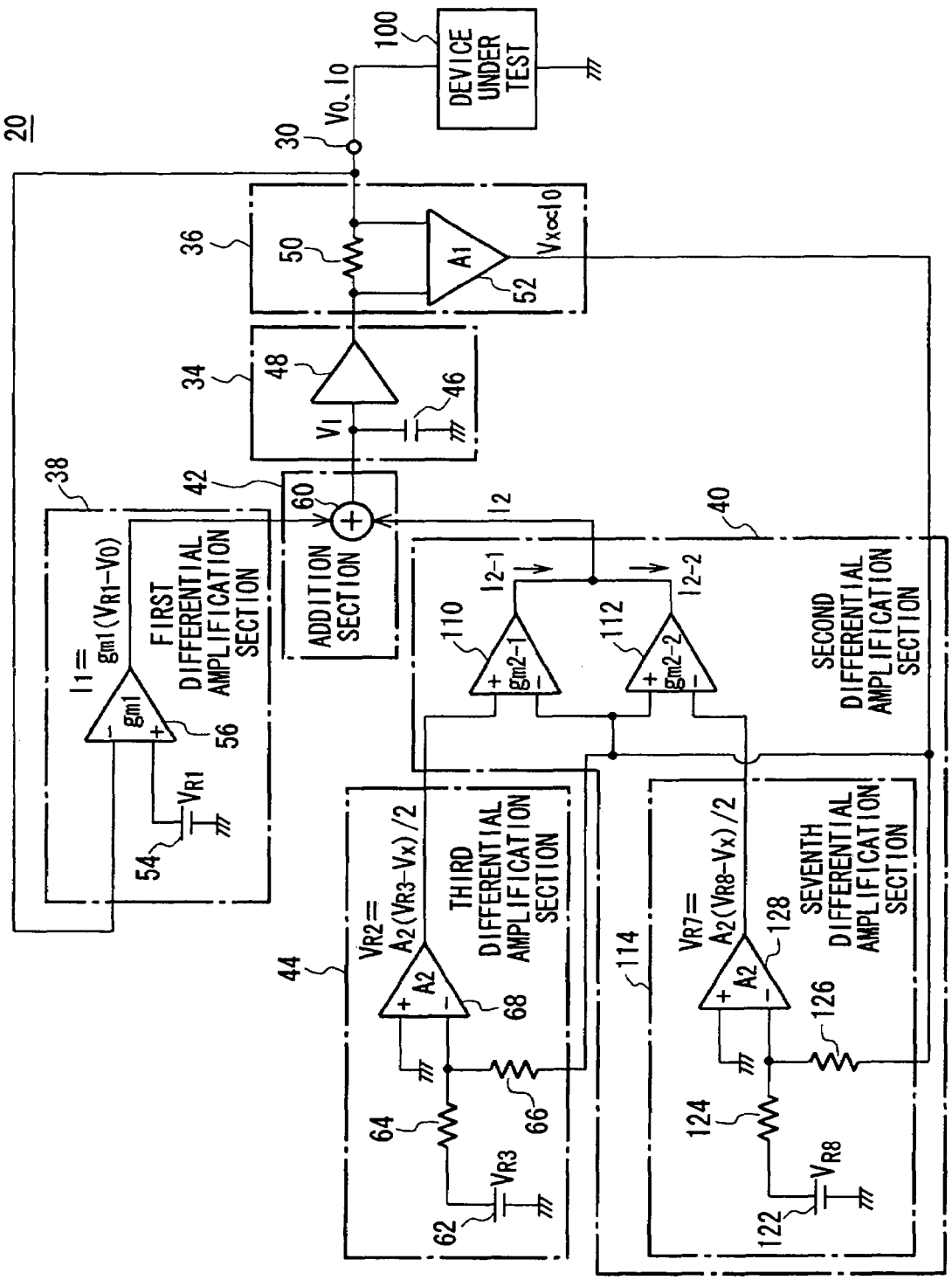
FIG. 6 is a view showing a configuration of a voltage generating apparatus according to the second alternative example of the present embodiment along with a device under test.
Figure 7:
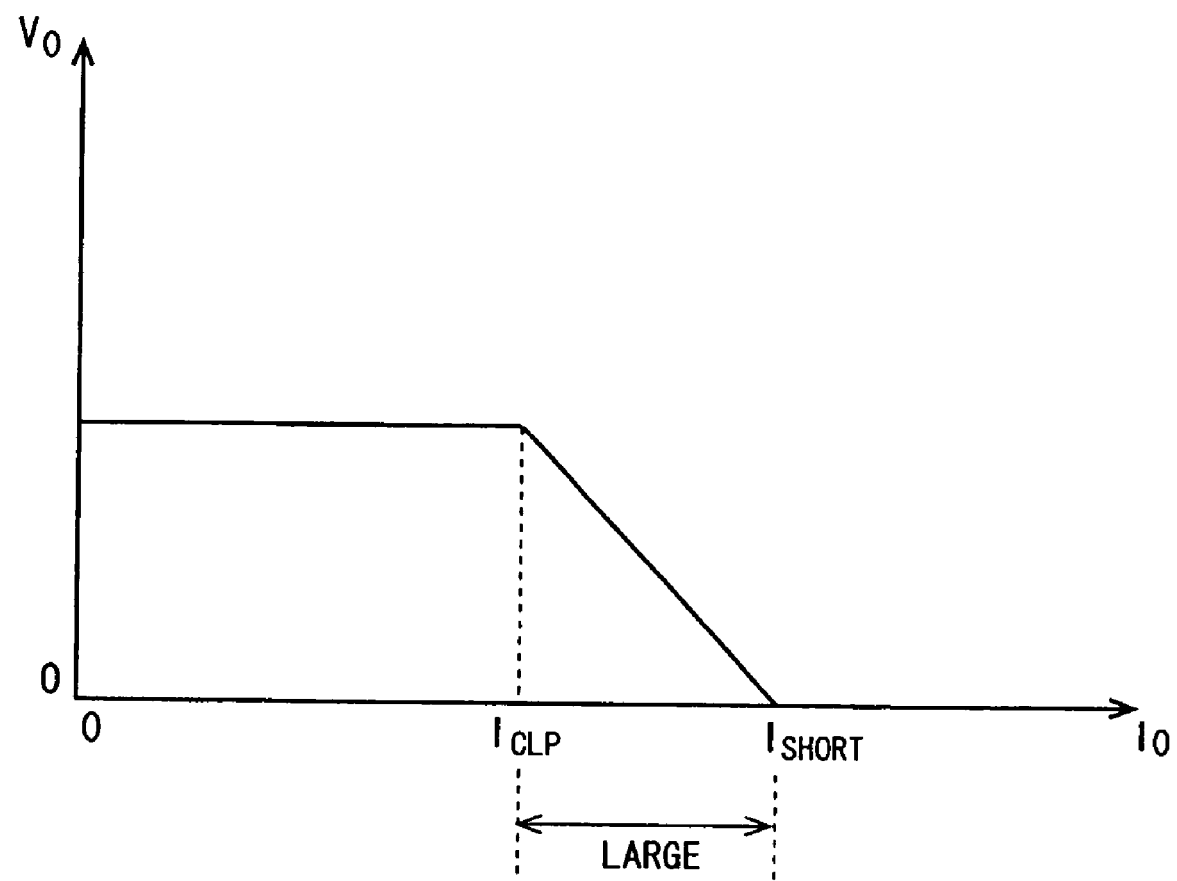
FIG. 7 is a view showing relation of a power source voltage $V_o$ to a power source current $I_o$ in a voltage generating apparatus including a conventional current limiting circuit.

FIG. 6 is a view showing a configuration of a voltage generating apparatus 20 according to the second alternative example of the present embodiment along with the device under test 100. In addition, since the voltage generating apparatus 20 shown in FIG. 6 has the generally same configuration and function as those of the voltage generating apparatus 20 shown in FIG. 2, their descriptions will be omitted except points of difference about the generally same components as those included in the voltage generating apparatus 20 shown in FIG. 2.

A second differential amplification section 40 according to the present alternative example has a third current output differential amplifier 110, a fourth current output differential amplifier 112, and a seventh differential amplification section 114.

The third current output differential amplifier 110 inputs a second reference voltage $V_{R2}$ that becomes small as a power source current $I_O$ becomes larger and a detecting voltage $V_X$ that becomes large as the power source current $I_O$ becomes larger. Then, the third current output differential amplifier 110 outputs a plus current $I_{2-1}$ in proportion to a voltage obtained by subtracting the detecting voltage $V_X$ from the second reference voltage $V_{R2}$. Furthermore, the third current output differential amplifier 110 sets the current $I_{2-1}$ to zero when the detecting voltage $V_X$ shows that the power source current $I_O$ is not less than a limiting current $I_{CLP}$.

The fourth current output differential amplifier 112 inputs a seventh reference voltage $V_{R7}$ that becomes small as the power source current $I_O$ becomes larger and the detecting voltage $V_X$ that becomes large as the power source current $I_O$ becomes larger. Then, the fourth current output differential amplifier 112 outputs a minus current $I_{2-2}$ of which the size of an absolute value is proportional to a voltage obtained by subtracting the seventh reference voltage $V_{R7}$ from the detecting voltage $V_X$. In other words, the fourth current output differential amplifier 112 absorbs the current $I_{2-2}$. In this case, as an example, the fourth current output differential amplifier 112 may have mutual conductance of which polarity is opposite to the third current output differential amplifier 110 and an absolute value is the generally same as each other. Furthermore, the fourth current output differential amplifier 112 sets the current $I_{2-2}$ to zero when the detecting voltage $V_X$ shows that the power source current $I_O$ is not more than an inverse limiting current $-I_{CLP}$.

The seventh differential amplification section 114 supplies a voltage obtained by amplifying a difference voltage obtained by subtracting the detecting voltage $V_X$ according to the power source current $I_O$ from a preset eighth reference voltage $V_{R8}$ to the fourth current output differential amplifier 112 as the seventh reference voltage $V_{R7}$. In this way, the seventh differential amplification section 114 can output the seventh reference voltage $V_{R7}$ that becomes small as the power source current $I_O$ becomes larger.

In the present example, as an example, the seventh differential amplification section 114 may include a third voltage generating section 122, a third resistor 124, a fourth resistor 126, and a third voltage output differential amplifier 128. The third voltage generating section 122 generates an eighth reference voltage $V_{R8}$. The third resistor 124 and the fourth resistor 126 subtract the eighth reference voltage $V_{R8}$ generated from the third voltage generating section 122 from the detecting voltage $V_X$ output from the first voltage output differential amplifier 52, in order to generate a partial-pressure voltage $((V_X-V_{R8})/2)$ obtained by dividing the subtracted result by a predetermined resistance ratio (for example, ½). The third voltage output differential amplifier 128 supplies the seventh reference voltage $V_{R7}$ in proportion to a voltage obtained by subtracting the partial-pressure voltage $((V_X-V_{R8})/2)$ generated from the third resistor 124 and the fourth resistor 126 from a ground voltage (0V) to the fourth current output differential amplifier 112. As an example, the third voltage output differential amplifier 128 may have an amplification factor generally same as that of the second voltage output differential amplifier 68 included in the third differential amplification section 44. In this way, the third voltage output differential amplifier 128 can output the seventh reference voltage $V_{R7}$ that becomes small as the power source current $I_O$ becomes larger.

According to the second differential amplification section 40 as described above, since the current $I_{2-1}$ output from the third current output differential amplifier 110 and the current $I_{2-2}$ absorbed by the fourth current output differential amplifier 112 are generally identical with each other when the power source current $I_O$ is larger than the inverse limiting current $-I_{CLP}$ and smaller than the limiting current $I_{CLP}$, it is possible to set the second control current $I_2$ to zero.

Then, according to the second differential amplification section 40, since the current $I_{2-1}$ output from the third current output differential amplifier 110 becomes zero and the current $I_{2-2}$ absorbed by the fourth current output differential amplifier 112 is not changed when the power source current $I_O$ is not less than the limiting current $I_{CLP}$, it is possible to absorb the current $I_2$ ($=I_{2-2}$) from the addition section 42.

Furthermore, according to the second differential amplification section 40, since the current $I_{2-2}$ absorbed by the fourth current output differential amplifier 112 becomes zero and the current $I_{2-1}$ output from the third current output differential amplifier 110 is not changed when the power source current $I_O$ is not more than the inverse limiting current $-I_{CLP}$, it is possible to supply the current $I_2$ ($=I_{2-1}$) to the addition section 42.

As described above, according to the voltage generating apparatus 20 of the present alternative example, it is possible to limit a plus or minus power source current $I_O$. In addition, a configuration of the second differential amplification section 40 according to the present example can be applied to the fifth differential amplification section 86 shown in FIG. 5 by inputting a power source voltage $V_O$ in place of a detecting voltage $V_X$.

Although the present invention has been described by way of an exemplary embodiment, it should be understood that those skilled in the art might make many changes and substitutions without departing from the spirit and scope of the present invention. It is obvious from the definition of the appended claims that embodiments with such modifications also belong to the scope of the present invention.

As apparent from the above description, according to the present invention, it is possible to realize a voltage generating apparatus, a current generating apparatus, and a test apparatus for limiting a power source current and a power source voltage with a good characteristic.

What is claimed is:

1. A voltage generating apparatus that outputs a power source voltage from a voltage outputting terminal, comprising:
    a voltage outputting section that outputs the power source voltage according to a current or voltage to be input;
    a first differential amplification section that compares the power source voltage and a preset first reference voltage to output a first control current or voltage reducing the power source voltage output from said voltage outputting section when the power source voltage is larger than the first reference voltage and output the first control current or voltage raising the power source voltage output from said voltage outputting section when the power source voltage is smaller than the first reference voltage;
    a current detector that detects a detecting voltage according to a power source current output from the voltage outputting terminal;
    a second differential amplification section that compares the detecting voltage detected from said current detector and a second reference voltage to output a second control current or voltage reducing the power source voltage when a value obtained by subtracting the second reference voltage from the detecting voltage is larger;
    an addition section that inputs a current or voltage obtained by adding the first control current or voltage and the second control current or voltage into said voltage outputting section; and
    a third differential amplification section that supplies a voltage obtained by amplifying a difference voltage obtained by subtracting the detecting voltage from a preset third reference voltage to said second differential amplification section as the second reference voltage.

2. The voltage generating apparatus as claimed in claim 1, wherein said current detector comprises:
    a series resistor that is provided on electric wiring between an output of said voltage outputting section and the voltage outputting terminal; and a differential amplifier that detects the power source current by outputting a detecting voltage according to a potential difference between both ends of the series resistor.

3. A test apparatus that tests a device under test, comprising:

a voltage generating apparatus that outputs a power source voltage to be supplied to the device under test from a voltage outputting terminal; and a test processing section that tests the device under test in a state that said voltage generating apparatus has supplied the power source voltage to the device under test, wherein said voltage generating apparatus comprises:

a voltage outputting section that outputs the power source voltage according to a current or voltage to be input;

a first differential amplification section that compares the power source voltage and a preset first reference voltage to output a first control current or voltage reducing the power source voltage output from said voltage outputting section when the power source voltage is larger than the first reference voltage and output the first control current or voltage raising the power source voltage output from said voltage outputting section when the power source voltage is smaller than the first reference voltage;

a current detector that detects a detecting voltage according to a power source current output from the voltage outputting terminal;

a second differential amplification section that compares the detecting voltage detected from said current detector and a second reference voltage to output a second control current or voltage reducing the power source voltage when a value obtained by subtracting the second reference voltage from the detecting voltage is larger;

an addition section that inputs a current or voltage obtained by adding the first control current or voltage and the second control current or voltage into said voltage outputting section; and a third differential amplification section that supplies a voltage obtained by amplifying a difference voltage obtained by subtracting the detecting voltage from a preset third reference voltage to said second differential amplification section as the second reference voltage.

4. The voltage generating apparatus as claimed in claim 1, wherein said third differential amplification section reduces an amplification degree in a high-frequency area and increases an amplification degree in a low-frequency area.

* * * * *